(12) United States Patent
Tsutsui et al.

(10) Patent No.: US 6,885,246 B2
(45) Date of Patent: Apr. 26, 2005

(54) HIGH FREQUENCY AMPLIFIER

(75) Inventors: Takayuki Tsutsui, Saku (JP); Hiroyuki Nagamori, Komoro (JP); Kouichi Matsushita, Komoro (JP); Nobuhiro Matsudaira, Chigasaki (JP)

(73) Assignee: Renesas Technology Corp., Tokyo (JP)

( * ) Notice: Subject to any disclaimer, the term of this patent is extended or adjusted under 35 U.S.C. 154(b) by 0 days.

(21) Appl. No.: 10/369,650

(22) Filed: Feb. 21, 2003

(65) Prior Publication Data
US 2003/0184382 A1 Oct. 2, 2003

(30) Foreign Application Priority Data
Mar. 29, 2002 (JP) ........................................ 2002-094135

(51) Int. Cl.$^7$ ................................................. H03G 3/20
(52) U.S. Cl. ...................................... 330/285; 330/133
(58) Field of Search ................................. 330/129, 133, 330/134, 285, 297

(56) References Cited

U.S. PATENT DOCUMENTS 5,251,331 A * 10/1993 Schwent et al. ......... 455/127.4
6,433,639 B1 * 8/2002 Numanami et al. ......... 330/277
6,636,114 B2 * 10/2003 Tsutsui et al. ................ 330/51

* cited by examiner

Primary Examiner—Steven J. Mottola
(74) Attorney, Agent, or Firm—Mattingly, Stanger, Malur & Brundidge, P.C.

(57) ABSTRACT

The present invention provides a high frequency amplifier using a power supply voltage regulate circuit for the purpose of compensating for variations in power supply voltage. The high frequency amplifier comprises three-stage power amplifiers which amplify an input signal and output the amplified signal, a bias circuit which supplies bias voltages for controlling these power amplifiers, a regulate circuit which compensates for variations in noise or gain with respect to the variations in the power supply voltage for driving the power amplifiers, etc. The regulate circuit holds constant an output voltage Vddc with respect to variations in power supply voltage Vdd and outputs the constant-held output voltage Vddc as a power supply voltage for the power amplifiers.

8 Claims, 7 Drawing Sheets

HIGH FREQUENCY AMPLIFIER

BACKGROUND OF THE INVENTION

The present invention relates to a high frequency amplifier, and a technology effective if applied to a high frequency amplifier which is built in a wireless communication system such as a cellular phone and which is variably inputted with power (amplitude or/and current) of an input signal in particular from outside and capable of being shared between both a GMSK (Gaussian filtered Minimum Shift Keying) system and an EDGE (Enhanced Data rates for GSM Evolution) system.

According to investigations of the present inventors, the following technology is considered as to a cellular phone with a high frequency amplifier built therein.

For example, the cellular phone has built therein a high frequency amplifier formed by integrally moduling power amplifiers using semiconductor amplifying elements such as MOSFETs, GaAs-MESFET in an output unit on the transmitting side and a bias circuit therefor, etc. together with a baseband circuit having the function of controlling transmission/reception, etc., and a high frequency circuit having the function of modulating and demodulating a transmit/receive signal, etc.

In the high frequency amplifier for such a cellular phone, a control system for fixing power of a signal inputted to each of power amplifiers and varying a bias voltage for controlling the power amplifier is used as a power control method using a GSM (Global System for Mobile Communication). The control system for varying the bias voltage is a method of supplying a bias voltage to a gate terminal of each power amplifying transistor and controlling an output level so as to reach output power necessary to make a phone call.

SUMMARY OF THE INVENTION

Meanwhile, the following have become apparent as a result of investigations of the high frequency amplifier for the cellular phone by the present inventors.

In the high frequency amplifier for the cellular phone, for example, there has been a demand for a change from the control system for fixing the power of the signal inputted to each power amplifier and varying the gate bias voltage for controlling the power amplifier to a control system for varying power of a signal inputted to each power amplifier in reverse and fixing a gate bias voltage for controlling the power amplifier.

Therefore, a study will be made of a case in which a power control system is changed and a control system for varying power of an input signal is adopted as an alternative to it in both modes of a GMSK system and an EDGE system. When, for example, the control is effected under the fixing of the power of the input signal+the varying of the gate bias voltage, the gate bias voltage is adjusted so that the gain becomes constant (i.e., noise becomes constant) even if a battery voltage rises.

However, a problem arises in that when the control is performed by varying the power of the input signal, the gain of each power amplifier increases upon rising of the battery voltage, and hence receiving-band noise characteristics deteriorate.

It is therefore an object of the present invention to provide a high frequency amplifier which is shared between a GMSK system and an EDGE system and which is capable of suppressing variations in gain even with respect to variations in power supply voltage where power of an input signal is variably inputted from outside, and thereby preventing deterioration of receiving-band noise characteristics.

The above, other objects and novel features of the present invention will become apparent from the description of the present specification and the accompanying drawings.

A summary of a typical one of the inventions disclosed in the present application will be described in brief as follows:

The present invention is applied to a high frequency amplifier which includes a plurality of stages of power amplifiers which amplify an input signal and output the amplified signal, and a bias circuit which supplies bias voltages for controlling the power amplifiers, and which is variably inputted with power of the input signal from outside and capable of being shared between a GMSK system and an EDGE system. The present invention has the following features.

(1) As to a power supply voltage for driving the power amplifiers, there is provided a compensating circuit for compensating for variations in noise or gain with respect to variations in the power supply voltage. Thus, since it serves so as to compensate for the power supply voltage applied to the power amplifiers with respect to the variations in the power supply voltage, the variations in the gain can be suppressed and hence receiving-band noise characteristics can be held without deterioration thereof.

(2) A regulation circuit, which holds constant an output voltage with respect to the variations in the power supply voltage, is used as the compensating circuit. Thus, the regulation circuit is capable of fixing the gain of each power amplifier, which rises when the power supply voltage is raised and decreases when the power supply voltage is reduced, i.e., a voltage value per se at a drain terminal of a power amplifying transistor of each power amplifier to a constant value.

(3) A first bias circuit, which generates an output voltage having a reverse characteristic with respect to the variations in the power supply voltage and outputs the output voltage, is used as the compensating circuit. In particular, the first bias circuit applies the output voltage having the reverse characteristic to a control terminal of at least the first-stage power amplifier as a bias voltage. Thus, the first bias circuit is capable of compensating for the gain of each power amplifier, which rises when the power supply voltage increases, and decreases when the power supply voltage is reduced, i.e., compensating for a bias voltage at a gate terminal of the power amplifying transistor of each power amplifier so as to reach a reverse characteristic.

DETAILED DESCRIPTION OF THE PREFERRED EMBODIMENTS

Figure 1:
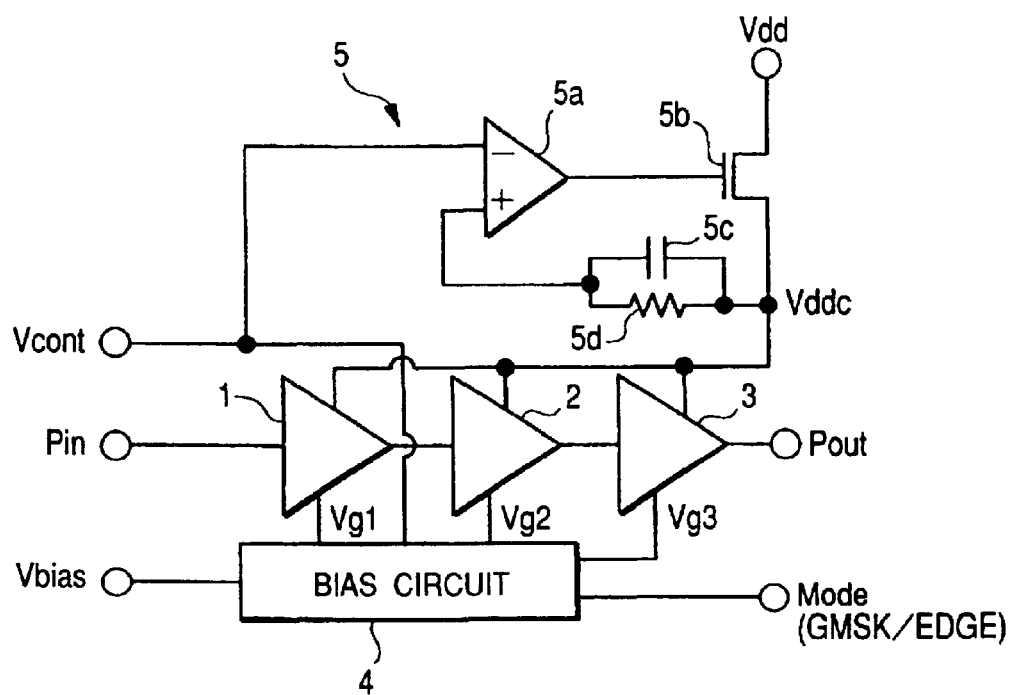
FIG. 1 is a schematic configurational diagram showing a high frequency amplifier using a regulate circuit, which is suitable for use in a cellular phone according to one embodiment of the present invention.

Preferred embodiments of the present invention will hereinafter be described in detail with reference to the accompanying drawings. Incidentally, components each having the same function in all drawings for describing the embodiments of the present invention are respectively identified by the same reference numerals and their repetitive description will therefore be omitted.

Although a high frequency amplifier to which the present invention is applied, is not restricted in particular, it is capable of being built in a cellular phone used as one example of a wireless communication system and variably inputted with power of an input signal from outside. Further, the high frequency amplifier can be shared between the GMSK system and the EDGE system. As examples of the cellular phone, an example in which a high frequency amplifier using a regulate circuit is built, and an example in which a high frequency amplifier using a reverse bias circuit is built, will be explained below.

One examples of a configuration and operation of the high frequency amplifier using the regulate circuit, which is employed in a cellular phone according to one embodiment of the present invention, will be described with reference to FIG. 1. FIG. 1 shows a schematic configuration of the high frequency amplifier using the regulate circuit.

In FIG. 1, the first high frequency amplifier according to the present embodiment serves as a high frequency amplifier using a power supply voltage regulate circuit to compensate for variations in power supply voltage, and comprises power amplifiers 1, 2 and 3 of three stages, which amplify an input signal and output the amplified signal, a bias circuit 4 which supplies bias voltages for controlling these power amplifiers 1, 2 and 3, a regulate circuit 5 which compensates for variations in noise or gain with respect to the variations in power supply voltage for driving the power amplifiers 1, 2 and 3, etc.

As the power amplifiers 1, 2 and 3, power amplifiers corresponding to three stages of a first or initial stage, a middle stage and a final stage are cascade-connected. They comprise power amplifying transistors or the like such as MOSFETs respectively. These respective amplifying transistors are connected in a three-stage configuration wherein a gate terminal of the middle-stage power amplifying transistor is connected to a drain terminal of the initial-stage power amplifying transistor and a gate terminal of the final-stage power amplifying transistor is connected to a drain terminal of the middle-stage power amplifying transistor. The bias circuit 4 applies bias voltages Vg1, Vg2 and Vg3 to their corresponding gate terminals. In the power amplifying circuits 1, 2 and 3, input power (input signal) Pin is supplied to the first-stage power amplifier 1 and amplified by the first-stage power amplifier 1, the middle-stage power amplifier 2 and the final-stage power amplifier 3 in that order, after which the amplified power is outputted from the final-stage power amplifier 3 as output power (output signal) Pout necessary to make a phone call.

The output power Pout is determined based on a signal for designating or specifying an output level supplied from an unillustrated base band circuit. The signal for specifying the output level is generated based on, for example, the distance to a base station, i.e., an output level determined according to the strength of a radio wave.

The bias circuit 4 comprises, for example, resistors equal to the number corresponding to the power amplifiers 1, 2 and 3, etc. The bias circuit 4 is a circuit for applying the bias voltages Vg1, Vg2 and Vg3 to their corresponding gate terminals of the respective power amplifying transistors of the power amplifiers 1, 2 and 3. The bias circuit 4 is controlled based on an input bias control signal Vbias with a control voltage Vcont as the reference to thereby apply the bias voltages Vg1, Vg2 and Vg3 to the gate terminals of the power amplifying transistors through the resistors respectively. Further, the bias circuit 4 is supplied with a modulation mode switch signal Mode and is capable of performing transmission based on the EDGE system in addition to transmission based on the GMSK system.

The regulation circuit 5 comprises, for example, a comparator 5a, a transistor 5b such as a PMOSFET or the like, a condenser 5c and a resistor 5d constituting a CR circuit, etc. The regulation circuit 5 is a circuit for keeping an output voltage Vddc constant with respect to the power supply voltage Vdd and outputting the output voltage Vddc kept constant. The regulation circuit 5 allows the comparator 5a to compare a voltage fed back from a drain terminal of the transistor 5b through the CR circuit with the control voltage Vcont used as the reference with respect to the variations in power supply voltage Vdd applied to a source terminal of the transistor 5b. The regulation circuit 5 is operated so as to keep the voltage at the drain terminal of the transistor 5b constant and applies the constant-kept output voltage Vddc to source terminals of the respective power amplifying transistors of the power amplifiers 1, 2 and 3.

Incidentally, although not shown in the drawing in the configuration of the high frequency amplifier, microstrip lines, which serve as inductance elements for matching impedances among the input stage, respective stages and output stage are respectively provided for pre-stages and post-stages of the respective power amplifiers 1, 2 and 3. Further, condensers are connected in series with theses microstrip lines and serve so as to cut off the power supply voltage Vdd and dc voltages of the gate bias voltage Vg1, Vg2 and Vg3.

In the present embodiment, although not restricted in particular, the final-stage power amplifier 3 of the power amplifiers 1, 2 and 3 is made up of discrete parts (output power MOSFET and the like). The first-stage and middle-stage power amplifiers 1 and 2, the bias circuit 4 for generating the gate bias voltages Vg1, Vg2 and Vg3, the regulate circuit 5 for outputting the constant-kept output voltage Vddc, etc. are configured on one semiconductor chip as a semiconductor integrated circuit.

The semiconductor integrated circuit and elements such as condensers or the like connected to the input stage, between the respective stages and to the output stage of the power amplifiers 1, 2 and 3 are mounted or packaged on a common ceramic substrate and configured as modules. The aforementioned microstrip lines are made up of conductive layer patterns of copper or the like formed on, for example, a ceramic substrate with a semiconductor chip mounted thereon, so as to assume or take desired inductance values.

In such a high frequency amplifier, the regulation circuit 5 can fix gains of the power amplifiers 1, 2 and 3, which increase when the power supply voltage Vdd is raised and decrease when the power supply voltage Vdd decreases, i.e., voltage values per se at the drain terminals of the respective power amplifying transistors of the power amplifiers 1, 2 and 3 to a constant value. Namely, the regulation circuit 5 receives the power supply voltage Vdd at the source terminal of the transistor 5b and controls the power supply voltage Vdd so as to drop when the power supply voltage Vdd rises higher than the control voltage Vcont and controls it so as to increase when the power supply voltage Vdd is made lower than the control voltage Vcont in reverse, thereby making it possible to always keep constant the output voltage Vddc with respect to the variations in power supply voltage Vdd.

Figure 2:
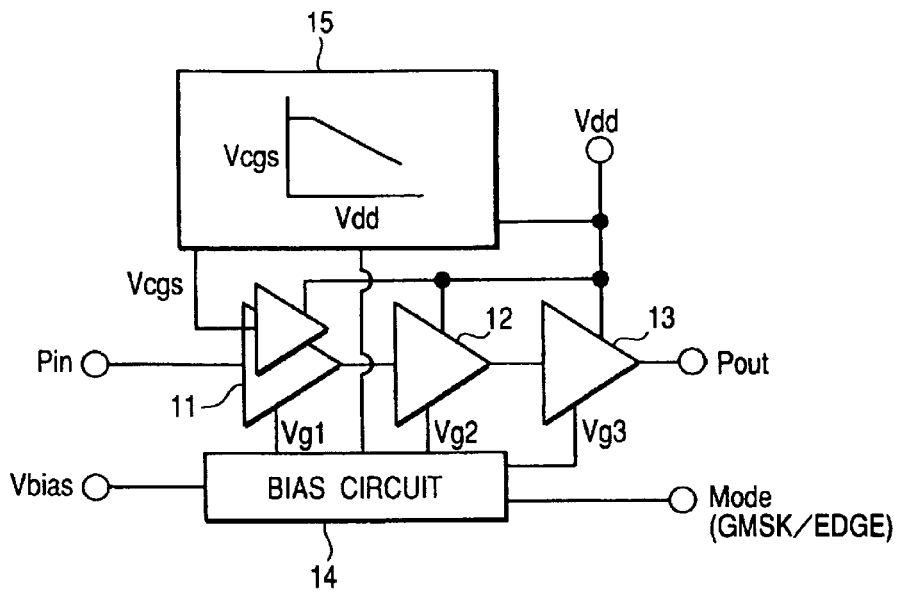
FIG. 2 is a schematic configurational diagram illustrating a high frequency amplifier using a reverse bias circuit, which is suitable for use in a cellular phone according to one embodiment of the present invention.

One examples of a configuration and operation of a high frequency amplifier using a reverse bias circuit, which is employed in a cellular phone according to one embodiment of the present invention, will be described with reference to FIGS. 2 through 4. FIG. 2 shows a schematic configuration of the high frequency amplifier using the reverse bias circuit, FIG. 3 shows a circuit configuration of a power amplifier using a dual gate MOSFET, and FIG. 4 shows a circuit configuration of the reverse bias circuit, respectively.

In FIG. 2, the second high frequency amplifier according to the present embodiment serves as a high frequency amplifier using a power supply voltage reverse bias circuit to compensate for variations in power supply voltage, and comprises power amplifiers 11, 12 and 13 of three stages, which amplify an input signal and output the amplified signal, a bias circuit 14 which supplies bias voltages for controlling these power amplifiers 11, 12 and 13, a reverse bias circuit 15 which compensates for variations in noise or gain with respect to the variations in power supply voltage for driving the power amplifiers 11, 12 and 13, etc.

As the power amplifiers 11, 12 and 13, power amplifiers corresponding to three stages of a first or initial stage, a middle stage and a final stage are cascade-connected in a manner similar to the one embodiment referred to above. They comprise power amplifying transistors or the like such as MOSFETs respectively in a manner similar to the one embodiment referred to above. The first-stage power amplifier 11 is different in configuration from the one embodiment referred to above.

Figure 3:
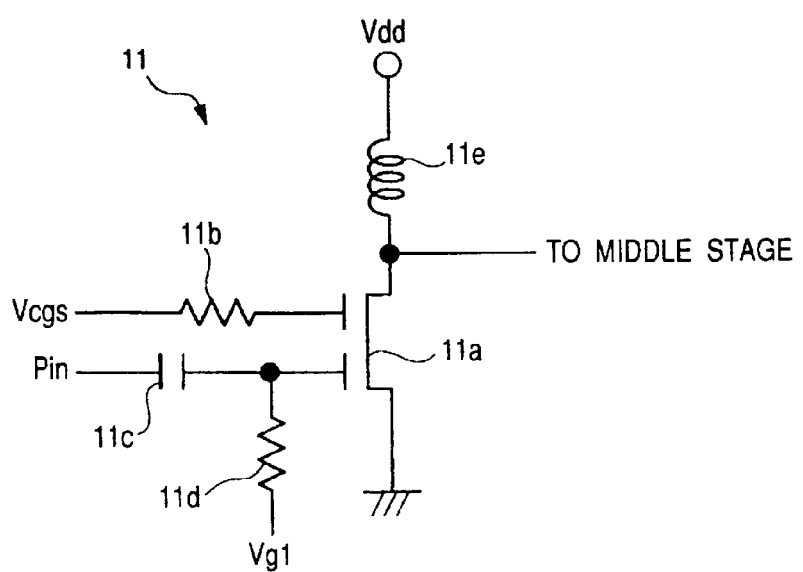
FIG. 3 is a circuit diagram showing a power amplifier using a dual gate MOSFET in the high frequency amplifier using the reverse bias circuit, which is suitable for use in the cellular phone according to the one embodiment of the present invention.
Figure 4:
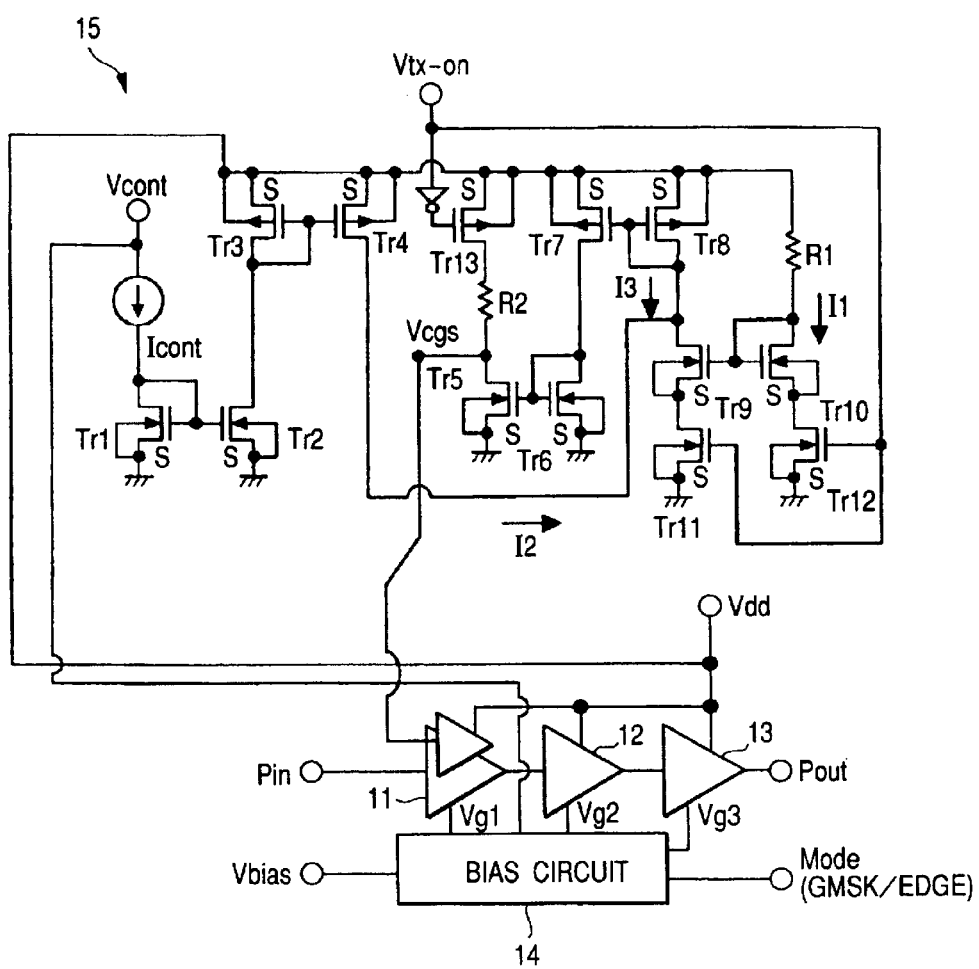
FIG. 4 is a circuit diagram illustrating the reverse bias circuit employed in the high frequency amplifier using the reverse bias circuit, which is suitable for use in the cellular phone according to the one embodiment of the present invention.

As illustrated in FIG. 3 by way of example, for instance, the first-stage power amplifier 11 is made up of a power amplifying transistor 11a or the like such as a dual gate MOSFET, etc. A reverse bias voltage Vcgs is applied from the reverse bias circuit 15 to a first gate terminal of the power amplifying transistor 11a through a resistor 11b, and input power Pin is supplied to a second gate terminal of the power amplifying transistor 11a through a condenser 11c. Incidentally, the bias circuit 14 applies a bias voltage Vg1 to the second gate terminal of the power amplifying transistor 11a through a resistor 11d. Further, a drain terminal of the power amplifying transistor 11a is connected to a source potential or power supply voltage Vdd through an inductance 11e, and a source terminal of the power amplifying transistor 11a is connected to a ground potential, respectively. The drain terminal of the power amplifying transistor 11a is connected to the middle-stage power amplifier 12.

The bias circuit 14 comprises resistors equal to the number corresponding to the power amplifiers 11, 12 and 13, etc. The bias circuit 14 is a circuit for applying the bias voltages Vg1, Vg2 and Vg3 to their corresponding gate terminals of the respective power amplifying transistors of the power amplifiers 11, 12 and 13.

The reverse bias circuit 15 is a circuit for generating an output voltage Vcgs having a reverse or inverse characteristic with respect to the variations in the power supply voltage Vdd and outputting the output voltage Vcgs therefrom. The reverse bias circuit 15 applies the output voltage Vcgs having the reverse characteristic to a control terminal of the first-stage power amplifier 11 as a bias voltage to thereby make it possible to compensate for the gain of the power amplifier 11, which rises when the power supply voltage Vdd is raised and decreases when the power supply voltage Vdd is reduced, i.e., compensate for the bias voltage so as to reach a reverse characteristic at the corresponding gate terminal of the power amplifying transistor of the power amplifier 11.

As shown in FIG. 4 by way of example, for instance, the reverse bias circuit 15 comprises transistors Tr1 through Tr12 such as PMOSFETs and NMOSFETs or the like, resistors R1 and R2, a current source, an inverter, etc. The transistors Tr1 and Tr2, Tr3 and Tr4, Tr5 and Tr6, Tr7 and Tr8, and Tr9 and Tr10 respectively constitute mirror circuits whose gate terminals are connected in common. Each of the transistors Tr11, Tr12 and Tr13 is a circuit for preventing a current from flowing into a terminal for the power supply voltage Vdd in excess of a cut-off current upon non-loading. Incidentally, the reverse bias circuit 15 is operated when a voltage level of a standby mode control signal Vtx-on is High.

When the transistors Tr5 and Tr6, Tr7 and Tr8, and Tr9 and Tr10 are made equal in mirror ratio in the reverse bias circuit 15, I1 is given by the following equation (1), and Vcgs is given by the following equation (2). Incidentally, I1, I2, Vcgs, Vdd, Vgs, R1, and R2 in the respective equations respectively indicate a current value of a current (I1), a current value of a current (I2), a voltage value of a reverse bias voltage (Vcgs), a voltage value of the power supply voltage (Vdd), a gate-source voltage value of each transistor, a resistance value of the resistor (R1), and a resistance value of the resistor (R2), respectively.

$$I1 = (Vdd - Vgs)/R1 \qquad (1)$$

$$Vcgs = Vdd - R2 \times (I1 - I2) \qquad (2)$$
$$= (1 - R2/R1) \times Vdd + R2 \times I2 + R2 \times Vgs/R1$$

When R2=2R1 is now set, for example, Vcgs is expressed in the following equation (3), and I2 is expressed in the following equation (4) respectively.

$$Vcgs=-Vdd+2Vgs+R2\times I2 \quad (3)$$

$$I2=N\times Icont \quad (4)$$

where N indicates a mirror conversion ratio of the transistor Tr1 to the transistor Tr4. Thus, Vcgs is rewritten as the following equation (5), and the relationship between Vdd (V) and Vcgs (V) results in a characteristic diagram shown in FIG. 2.

$$Vcgs=-Vdd+R2\times N\times Icont+2Vgs \quad (5)$$

where R2×N×Icont is constant, and Vgs is represented as the one-half power characteristic of I1. In this case, its change may be considered to be a negligible range.

Thus, when the power supply voltage Vdd based on battery power or the like rises where the transistors Tr5 and Tr6, Tr7 and Tr8, and Tr9 and Tr10 are set equal in mirror ratio, the current I1 increases. At this time, a current obtained by subtracting a current I2 equivalent to a current Icont mirror ratio from a terminal for a control voltage Vcont from the current I1 flows as a drain current of the transistor Tr8. This results in a current I3. Since the current Icont is constant, the current I3 increases with the power supply voltage Vdd. Thus, since the current flowing on the drain side of the transistor Tr5 increases, and a voltage drop developed across the resistor 2 increases with the rise in the power supply voltage Vdd, the voltage corresponding to the reverse bias voltage Vcgs results in a reverse characteristic with respect to the increase in the power supply voltage Vdd.

Figure 5:
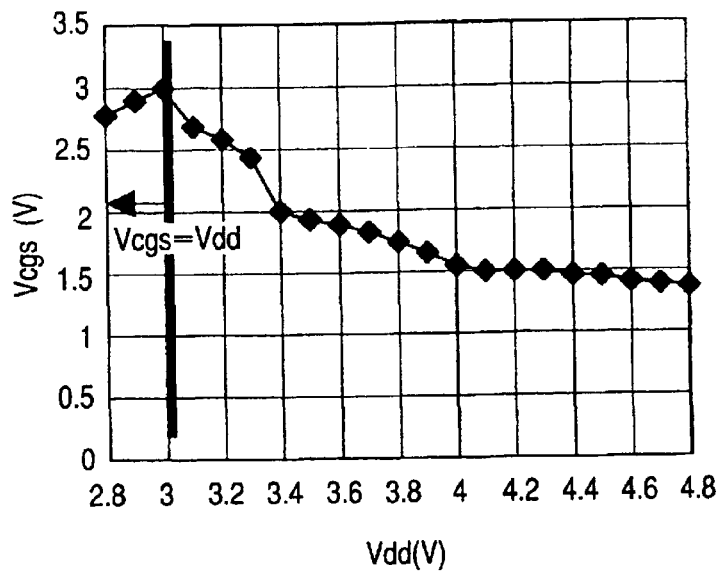
FIG. 5 is a characteristic diagram depicting a control characteristic of a reverse bias voltage vs. power supply voltage, which is obtained in the high frequency amplifier using the reverse bias circuit, which is suitable for use in the cellular phone according to the one embodiment of the present invention.

One example of the effect of the high frequency amplifier using the reverse bias circuit will next be described with reference to FIGS. 5 through 7. FIG. 5 shows a control characteristic of a reverse bias voltage vs power supply voltage, FIG. 6 shows the dependence of gain on power supply voltage, and FIG. 7 shows the dependence of gain on power supply voltage in a comparative technology or art with respect to the present invention, respectively.

When, for example, the reverse bias voltage Vcgs=power supply voltage Vdd is set to a power supply voltage of about 3V in the control characteristic of the reverse bias voltage vs power supply voltage as shown in FIG. 5, the reverse bias voltage Vcgs rises from about 2.8V to about 3V with a rise of the power supply voltage Vdd from about 2.8V to about 3V when the power supply voltage Vdd is less than or equal to about 3V. On the other hand, when the power supply voltage Vdd exceeds about 3V, the reverse bias voltage Vcgs decreases from about 3V to about 1.4V with a rise of the power supply voltage Vdd from about 3V to about 4.8V.

Figure 6:
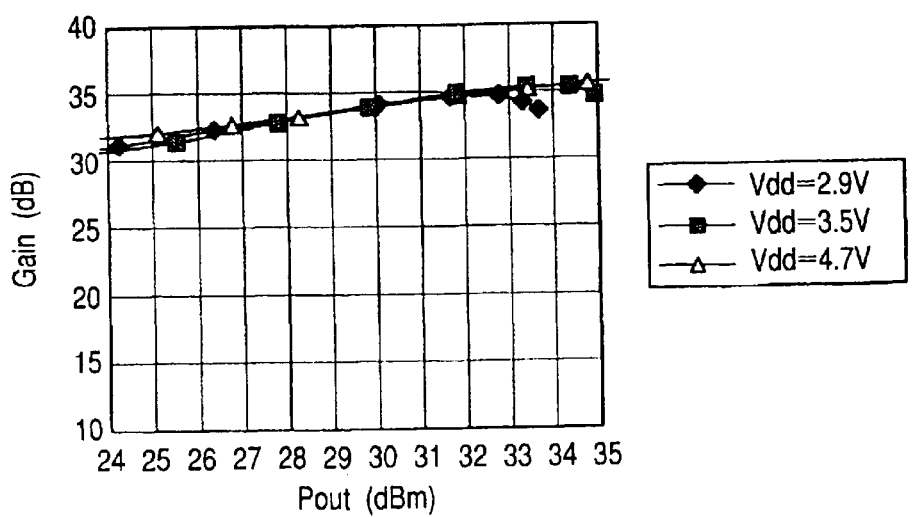
FIG. 6 is a characteristic diagram showing the dependence of gain on power supply voltage, which is related to the high frequency amplifier using the reverse bias circuit, which is suitable for use in the cellular phone according to the one embodiment of the present invention.

As to the characteristic of gain Gain with respect to output power Pout in the dependence of the gain on the power supply voltage as shown in FIG. 6, the gain increases from about 31 dB to about 35 dB with a rise of the output power Pout from about 24 dBm to about 35 dBm. However, there is little change in the value of the gain at the same output even in the case of any of the power supply voltage Vdd=2.9V, 3.5V and 4.7V. Thus, even when the power supply voltage Vdd decreases from about 3.5V to about 2.9V or rises from about 3.5V to about 4.7V in reverse, the amplification factor of the high frequency amplifier remains unchanged. Therefore, the gain eventually reaches a given constant curve with respect to the output power. Thus, it is possible to compensate for the influence of variations in the power supply voltage Vdd on the gain.

Figure 7:
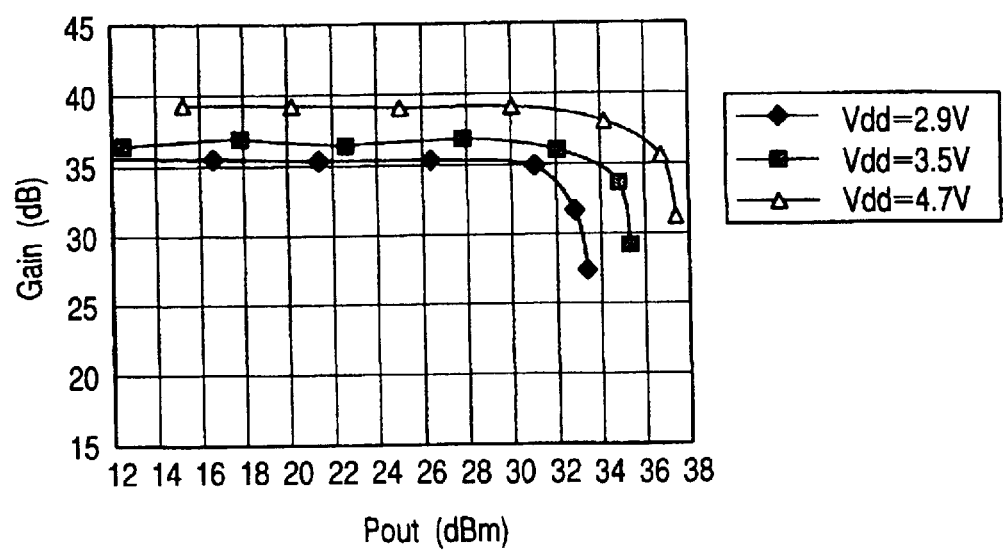
FIG. 7 is a characteristic diagram illustrating the dependence of gain on power supply voltage in a comparative technology with respect to the present invention illustrative of the high frequency amplifier using the reverse bias circuit, which is suitable for use in the cellular phone according to the one embodiment of the present invention.

On the other hand, the comparative art with respect to the present invention, i.e., the non-provision of the reverse bias circuit yields such dependence of gain on power supply voltage as shown in FIG. 7. Namely, as to the characteristic of gain Gain with respect to output power Pout, when the power supply voltage Vdd is reduced from about 3.5V to about 2.9V, the gain of each transistor decreases and hence the amplification factor of the high frequency amplifier is reduced, thus resulting in a reduction in the gain. When the power supply voltage Vdd rises from about 3.5V to about 4.7V in reverse, the gain of each transistor becomes large and hence the amplification factor of the high frequency amplifier increases, thus resulting in a rise in the gain. Consequently, variations in the power supply voltage Vdd exert an influence on the gain characteristic as they are.

When a battery is normally used as the power supply voltage Vdd in the cellular phone, the voltage of the battery greatly varies from Vdd=about 4.7V to about 2.9V during a period from immediately after its charge to battery exhaustion when the battery is a lithium battery, for example.

As mentioned above, (1) the method of allowing the regulate circuit 5 to fix the voltage value per se at the drain terminal of the high frequency amplifier to the constant value or (2) the method of allowing the reverse bias circuit 15 to compensate for the bias voltage for the gate terminal of the power amplifying transistor of the first-stage power amplifier 11 so as to reach the reverse characteristic is used for the gain of-the high frequency amplifier, which rises when the power supply voltage Vdd is raised and decreases when the power supply voltage Vdd is reduced. Thus, even if the ordinary battery is used, it servers in the direction to compensate for the power supply voltage or bias voltage applied to the high frequency amplifier with respect to variations in voltage. Therefore, the variations in the gain can be suppressed as shown in FIG. 6 and hence receiving-band noise characteristics can be held without deterioration thereof.

Figure 8:
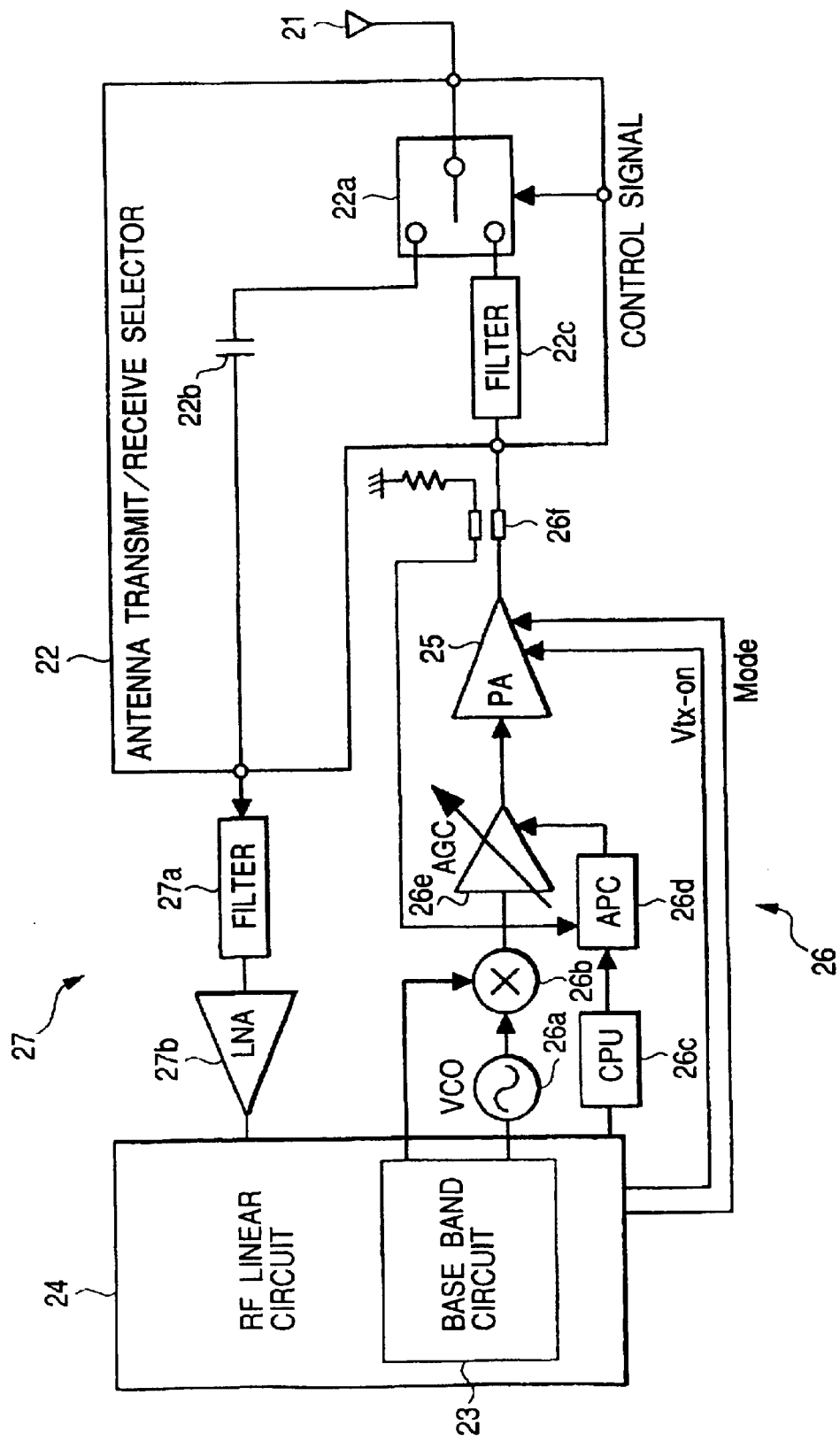
FIG. 8 is a schematic configurational diagram showing a cellular phone according to one embodiment of the present invention.

One example of a configuration of a cellular phone according to one embodiment of the present invention will next be described with reference to FIG. 8. FIG. 8 shows a schematic configuration of the cellular phone.

The cellular phone according to the present invention has a configuration wherein the high frequency amplifier using the regulate circuit or the high frequency amplifier using the reverse bias circuit is used, is built therein. The cellular phone comprises, for example, a transmission system circuit 26, which includes an antenna 21 for transmitting and receiving a signal wave, an antenna transmit/receive selector 22 connected to the antenna 21, a RF (Radio Frequency) linear circuit 24 including a base band circuit 23 having a transmission/reception control function and the like, the aforementioned power amplifier (PA) 25, etc. and has the function of modulating a transmit signal, etc., a reception system circuit 27 or the like having the function of demodulating a receive signal, etc.

The antenna transmit/receive selector 22 comprises, for example, a selector switch 22a for performing switching between transmission and reception, a condenser 22b connected to the transmitting side, a filter 22c connected to the receiving side, etc. The selector switch 22a of the antenna transmit/receive selector 2 controls switching to the transmitting side and receiving side in response to a control signal sent from the base band circuit 23 or the like, for example.

The base band circuit 23 of the RF linear circuit 24 comprises, for example, a DSP (Digital Signal Processor), a microprocessor, a semiconductor memory, etc. not illustrated in the drawing and is provided with the function of converting an audio signal to a baseband signal upon transmission, converting a receive signal to an audio signal upon reception, and generating various control signals such as a modulation mode switch signal Mode at transmission and reception, a standby mode control signal Vtx-on, etc.

The transmission system circuit 26 comprises, for example, a VCO (Voltage Controlled Oscillator) 26a, which is connected to the base band circuit 23 of the RF linear circuit 24 and generates oscillation signals lying in a plurality of frequency bands, a mixer 26b which modulates an IQ signal according to a carrier wave based on the oscillation signal generated from the VCO 26a, a CPU 26c connected to the RF linear circuit 24, an APC (Automatic Power Control) 26d which effects feedback, based on arithmetic processing of the CPU 26c to thereby perform power control, an AGC (Automatic Gain Control) 26e which controls the gain, based on the feedback control of the APC 26d in response to the modulated signal sent from the mixer 26b, the aforementioned power amplifier 25 which amplifies a signal outputted from the AGC 26e, a coupler 26f used for detecting an output level, which is connected to the power amplifier 25, etc. The APC 26d is feed-back controlled based on an output level detected by the coupler 26f. The power amplifier 25 is inputted with the standby mode control signal Vtx-on and modulation mode switch signal Mode sent from the RF linear circuit 24 and controlled according to a transmission mode.

The reception system circuit 27 comprises, for example, a filter 27a which is connected to the condenser 22b of the antenna transmit/receive selector 22 and eliminates an unnecessary wave from the receive signal, an LNA (Low Noise Amplifier) 27b connected to the filter 27a, etc.

Figure 9:
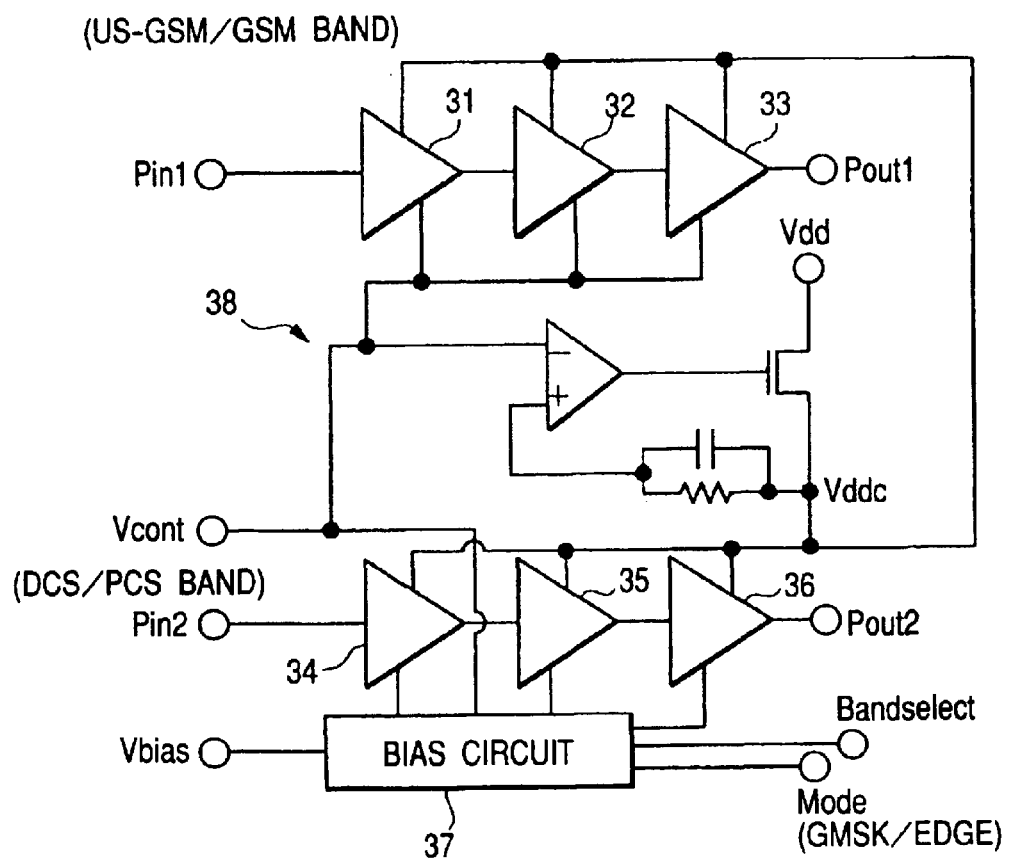
FIG. 9 is a schematic configurational diagram illustrating a high frequency amplifier adapted to a four-banded input control GMSK/EDGE system, which is suitable for use in a cellular phone according to one embodiment of the present invention.

One example of a configuration of a high frequency amplifier adapted to a four-banded input control GMSK/EDGE system, which is suitable for use in a cellular phone according to one embodiment of the present invention, will next be described with reference to FIG. 9. FIG. 9 schematically shows a configuration of the high frequency amplifier adapted to the four-banded input control GMSK/EDGE system.

The high frequency amplifier shown in FIG. 9 is configured as the high frequency amplifier adapted to the four-banded input control GMSK/EDGE system and comprises three-stage power amplifier 31, 32 and 33 which are applicable to a US-GSM (Global System for Mobile Communication)/GSM band and which amplify input power (input signal) Pin1 and output an output voltage (output signal) Pout1, three-stage power amplifiers 34, 35 and 36, which are applicable to a DCS (Digital Cellular System)/PCS (Personal Communication System) band and which amplify input power (input signal) Pin2 and output an output voltage (output signal) Pout2, a bias circuit 37 which shares among these power amplifiers 31 through 36 and which is inputted with a bias control signal Vbias, a modulation mode switch signal Mode, and a band select signal Bandselect and supplies bias voltages for controlling the respective power amplifiers 31 through 36, a regulate circuit 38 which compensates for variations in nose or gain with respect to variations in power supply voltage Vdd for driving the power amplifiers 31 through 36, etc.

In the present high frequency amplifier, the power amplifiers 31 through 36 and the regulate circuit 38 have functions similar to the aforementioned power amplifiers and regulate circuit shown in FIG. 1. The bias circuit 37 has a select function based on the band select signal Bandselect in addition to the function of the bias circuit shown in FIG. 1, and is applicable to a US-GSM/GSM/DCS/PCS band based on the GMSK system and a US-GSM/GSM/DCS/PCS band based on the EDGE system along with switching based on the modulation mode switch signal Mode on the basis of the band select signal Bandselect.

Incidentally, the present high frequency amplifier may use the reverse bias circuit shown in FIG. 2, which outputs the output voltage Vcgs having the reverse characteristic with respect to the variations in the power supply voltage Vdd, as an alternative to the regulate circuit 38.

Thus, according to the present embodiment, the regulate circuit 5 is used in the high frequency amplifier or the reverse bias circuit 15 is used therein to compensate for the variations in the power supply voltage Vdd, whereby the high frequency amplifier can be operated in the direction to compensate for the power supply voltage or bias voltages applied to the high frequency amplifier with respect to the variations in the power supply voltage Vdd. It is therefore possible to suppress variations in the gain and prevent deterioration of receiving-band noise characteristics.

According to the cellular phone using the high frequency amplifier according to the present embodiment, the GMSK/EDGE system has needed control systems corresponding to two systems of an APC for gate bias control upon power fixing of an input signal in the conventional GMSK system, and an AGC amplifier in the EDGE system. Since, however, the present embodiment enables power control based on the power of the input signal in the GMSK system, both modes are intended for one AGC amplifier system and hence a control system can be simplified.

Further, since the filter for reducing the receiving-band noise becomes unnecessary and the loss of a transmission band can be reduced, power consumption can be reduced, so that an improvement in talk time can be made. As a result, the cellular phone can be reduced in size and cost and improved in performance.

While the invention developed above by the present inventors has been described specifically based on the illustrated embodiments, the present invention is not limited to the embodiments. It is needless to say that various changes can be made thereto within the scope not departing from the substance thereof.

While the aforementioned embodiment has described the case in which the present invention is applied to the high frequency amplifier adapted to dual moding of the GMSK (saturation) system and the EDGE (linear) system of the cellular phone, the present invention is not limited to it. The present invention can be applied even to the North American AMPS (Advanced Mobile Phone Service, saturation) system currently in use, and a dual mode amplifier of a CDMA (Code Division Multiple Access) or TDMA (Time Division Multiple Access, linear) system. Further, the present invention is capable of adapting even to dual moding of a future GSM system and W (Wideband)-CDMA system.

The high frequency amplifier of the present invention is applicable as one capable of serving as one method for realizing all input power control using the present circuit configuration and controlling APC even in the case of a discrete amplifier configuration.

Further, the high frequency amplifier of the present invention is effective even if applied to a wiring communication apparatus or the like adapted to, for example, the GMSK/EDGE system or the like as well as to the cellular phone. Moreover, the high frequency amplifier can be applied to various wiring communication systems or the like.

Advantageous effects of a representative one of the inventions disclosed in the present application will be described in brief as follows:

(1) A high frequency amplifier can be provided which is shared between a GMSK system and an EDGE system and capable of suppressing variations in gain even with respect to variations in power supply voltage where power of an input signal is variably inputted from outside, and preventing deterioration of receiving-band noise characteristics.

(2) Since a cellular phone using the high frequency amplifier shared between the GMSK system and the EDGE system enables power control by the power of the input signal in the GMSK system, both modes of the GMSK and EDGE systems lead to a gain control amplifier of one system and hence a control system can be simplified.

(3) Since a filter for reducing receiving-band noise becomes unnecessary and the loss of a transmission band can be reduced in the cellular phone using the high frequency amplifier shared between the GMSK system and the EDGE system, power consumption can be reduced, so that an improvement in talk time can be made.

(4) Owing to the above (2) and (3), the cellular phone can be reduced in size and cost and improved in performance.

What is claimed is:

1. A high frequency amplifier, comprising:
    a plurality of stages of power amplifiers which amplify an input signal and output the same therefrom;
    a bias circuit which supplies bias voltages for controlling the power amplifiers;
    said input signal being inputted so as to be variable in power thereof and capable of being shared between a GMSK system and an EDGE system; and
    a compensating circuit which compensates for variations in noise or gain with respect to variations in power supply voltage for driving the power amplifiers,
    wherein the compensating circuit is a regulation circuit which holds constant an output voltage with respect to the variations in the power supply voltage.

2. A high frequency amplifier, comprising:
    a plurality of stages of power amplifiers which amplify an input signal and output the same therefrom;
    a bias circuit which supplies bias voltages for controlling the power amplifiers;
    said input signal being inputted so as to be variable in power thereof and capable of being shared between a GMSK system and an EDGE system; and
    a compensating circuit which compensates for variations in noise or gain with respect to variations in power supply voltage for driving the power amplifiers,
    wherein the compensating circuit is a first bias circuit which generates an output voltage having a reverse characteristic with respect to the variations in the power supply voltage and outputs the output voltage therefrom.

3. The high frequency amplifier according to claim 2, wherein the first bias circuit applies the output voltage having the reverse characteristic to a control terminal of at least the first-stage power amplifier of the plurality of stages of power amplifiers as a bias voltage.

4. A high frequency amplifier, comprising:
    a plurality of stages of power amplifiers which amplify an input signal and output the same therefrom;
    a bias circuit which supplies bias voltages for controlling the power amplifiers;
    said input signal being inputted so as to be variable in power thereof and capable of being shared between a GMSK system and an EDGE system; and
    a compensating circuit which compensates for variations in noise or gain with respect to variations in power supply voltage for driving the power amplifiers,
    wherein the power of the input signal is variable based on control of a gain control circuit connected to the outside.

5. A high frequency amplifier, comprising:
    a plurality of stages of power amplifiers which amplify an input signal and output the same therefrom;
    a bias circuit which supplies bias voltages for controlling the power amplifiers;
    said input signal being inputted so as to be variable in power thereof; and
    a compensating circuit which compensates for variations in noise or gain with respect to variations in power supply voltage for driving the power amplifiers,
    wherein the compensating circuit is a regulation circuit which holds constant an output voltage with respect to the variations in the power supply voltage.

6. A high frequency amplifier, comprising:
    a plurality of stages of power amplifiers which amplify an input signal and output the same therefrom;
    a bias circuit which supplies bias voltages for controlling the power amplifiers;
    said input signal being inputted so as to be variable in power thereof; and
    a compensating circuit which compensates for variations in noise or gain with respect to variations in power supply voltage for driving the power amplifiers,
    wherein the compensating circuit is a first bias circuit which generates an output voltage having a reverse characteristic with respect to the variations in the power supply voltage and outputs the output voltage therefrom.

7. The high frequency amplifier according to claim 6, wherein the first bias circuit applies the output voltage having the reverse characteristic to a control terminal of at least the first-stage power amplifier of the plurality of stages of power amplifiers as a bias voltage.

8. A high frequency amplifier, comprising:
    a plurality of stages of power amplifiers which amplify an input signal and output the same therefrom;
    a bias circuit which supplies bias voltages for controlling the power amplifiers;
    said input signal being inputted so as to be variable in power thereof; and
    a compensating circuit which compensates for variations in noise or gain with respect to variations in power supply voltage for driving the power amplifiers,
    wherein the power of the input signal is variable based on control of a gain control circuit connected to the outside.

* * * * *